(12) United States Patent
Chen et al.

(10) Patent No.: US 9,917,051 B2
(45) Date of Patent: Mar. 13, 2018

(54) CONDUCTIVE STRUCTURE AND METHOD OF FORMING THE SAME

(71) Applicant: Taiwan Semiconductor Manufacturing Company, Ltd., Hsin-Chu (TW)

(72) Inventors: Pin-Wen Chen, Keelung (TW); Chih-Wei Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/414,388

(22) Filed: Jan. 24, 2017

(65) Prior Publication Data

US 2017/0133318 A1    May 11, 2017

Related U.S. Application Data

(63) Continuation of application No. 14/333,961, filed on Jul. 17, 2014, now Pat. No. 9,564,359.

(51) Int. Cl.
| | |
|---|---|
| *H01L 21/4763* | (2006.01) |
| *H01L 21/768* | (2006.01) |
| *H01L 23/48* | (2006.01) |
| *H01L 21/70* | (2006.01) |
| *H01L 21/306* | (2006.01) |
| *H01L 23/52* | (2006.01) |
| *H01L 23/522* | (2006.01) |

(Continued)

(52) U.S. Cl.
CPC .... *H01L 23/5226* (2013.01); *H01L 21/76843* (2013.01); *H01L 21/76862* (2013.01); *H01L 21/76871* (2013.01); *H01L 21/76877* (2013.01); *H01L 23/528* (2013.01); *H01L 23/5329* (2013.01)

(58) Field of Classification Search
CPC ......... H01L 21/76832; H01L 21/76834; H01L 21/76844; H01L 21/76846; H01L 21/76873
USPC ................. 257/754, 774, E21.476, E23.011; 438/672, 625, 687
See application file for complete search history.

(56) References Cited

U.S. PATENT DOCUMENTS

| | | |
|---|---|---|
| 5,470,792 A | 11/1995 | Yamada |
| 6,260,256 B1 | 7/2001 | Sasaki |
| 2002/0155699 A1 | 10/2002 | Ueda |

(Continued)

FOREIGN PATENT DOCUMENTS

| | | |
|---|---|---|
| KR | 20050052105 A | 6/2005 |
| KR | 100599434 B1 | 7/2006 |

(Continued)

*Primary Examiner* — Kimberly Rizkallah
*Assistant Examiner* — Brian Turner
(74) *Attorney, Agent, or Firm* — Slater Matsil, LLP

(57) ABSTRACT

Conductive structures and method of manufacture thereof are disclosed. A barrier layer can line the first recess of a substrate. A first seed layer can be formed on the barrier layer and line a bottom of the first recess and partially line sidewalls of the recess. A first conductive material can partially fill the first recess to form a second recess. The top surface of the first conductive material can coincide with a vertical extent of the first seed layer and have a depression formed therein. A second seed layer can be formed on the barrier layer and line the second recess. A second conductive material can fill the second recess.

20 Claims, 13 Drawing Sheets

(51) Int. Cl.
*H01L 23/528* (2006.01)
*H01L 23/532* (2006.01)

(56) References Cited

U.S. PATENT DOCUMENTS

| | | |
|---|---|---|
| 2005/0085070 A1 | 4/2005 | Park |
| 2007/0049007 A1* | 3/2007 | Yang ................. H01L 21/76805 |
| | | 438/625 |
| 2008/0045010 A1 | 2/2008 | Wongsenakhum et al. |
| 2009/0026618 A1 | 1/2009 | Kim et al. |
| 2009/0111263 A1* | 4/2009 | Chen ...................... H01L 45/06 |
| | | 438/667 |
| 2011/0266676 A1* | 11/2011 | Isobayashi ........ H01L 21/76831 |
| | | 257/751 |
| 2012/0032334 A1 | 2/2012 | Lee et al. |
| 2013/0171822 A1 | 7/2013 | Chandrashekar et al. |
| 2013/0228880 A1 | 9/2013 | Vogt et al. |

FOREIGN PATENT DOCUMENTS

| | | |
|---|---|---|
| KR | 100753416 B1 | 8/2007 |
| KR | 20120096413 A | 8/2012 |

* cited by examiner

200

202 — Providing a substrate having a first recess and a second recess formed therein, wherein the first recess extends into the substrate by a first distance and the second recess extends into the substrate by a second distance smaller than the first distance 204 — Lining the first recess and the second recess with a first seed layer 206 — Exposing the first seed layer in the second recess and a portion of the first seed layer in the first recess proximate an opening of the first recess to a treatment plasma to form treated portions of the first seed layer 208 — Partially filling the first recess with a first conductive material, wherein the treated portions of the first seed layer are free from the first conductive material

Fig. 2

CONDUCTIVE STRUCTURE AND METHOD OF FORMING THE SAME

PRIORITY CLAIM AND CROSS-REFERENCE

This application is a continuation of U.S. application Ser. No. 14/333,961, filed on Jul. 17, 2014, entitled "Conductive Structure and Method of Forming the Same," which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. Concurrently, conductive structures, such as, for example, contact plugs, that provide an electrical connection to and/or from the various electronic components have also experienced continual reductions in critical dimensions and minimum feature size. However, these reductions in critical dimensions and minimum feature size are often accompanied by an increase in contact resistance of the conductive structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
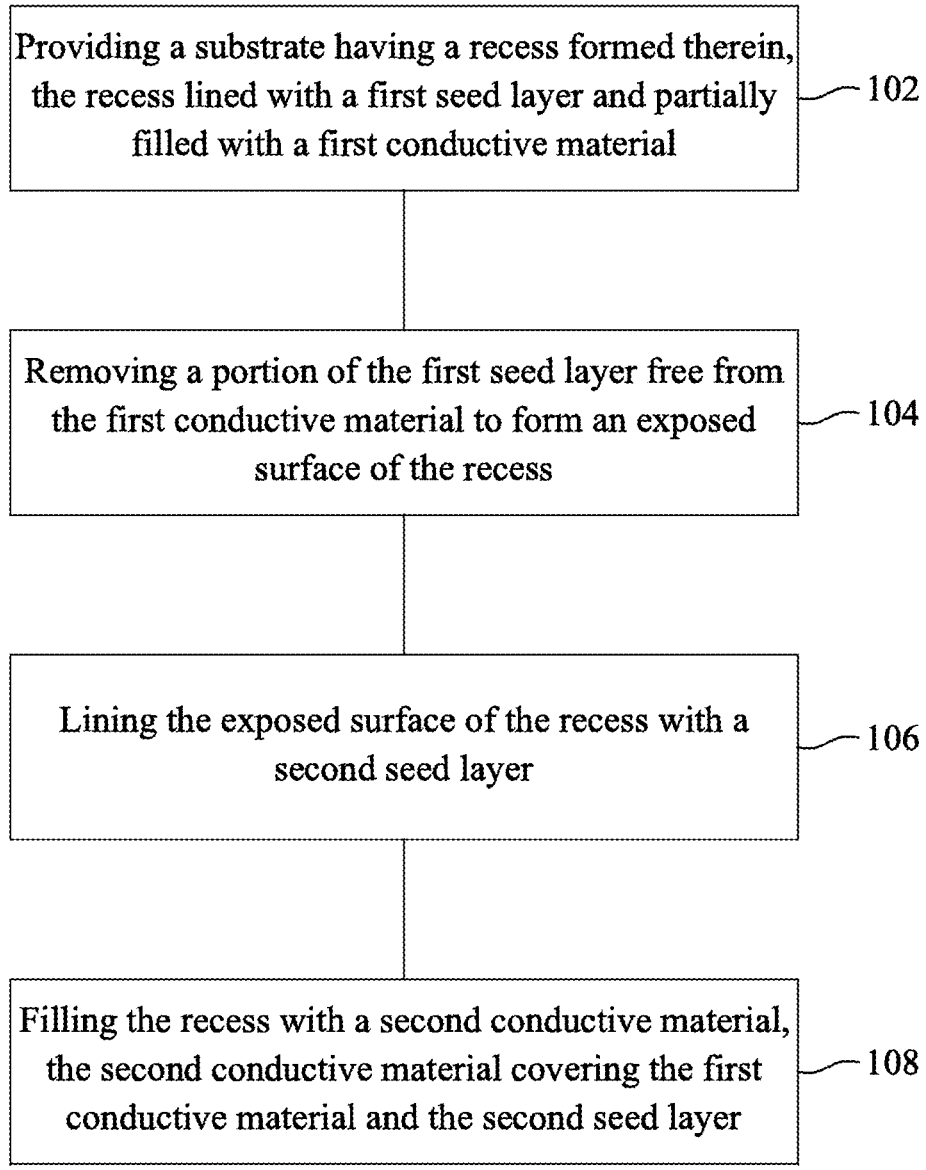
FIG. 1 and FIG. 2 show methods of forming conductive structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a method 100 of forming a conductive structure (e.g. a contact plug), in accordance with one or more embodiments. The method 100 may include: providing a substrate having a recess formed therein, the recess lined with a first seed layer and partially filled with a first conductive material (in 102); removing a portion of the first seed layer free from the first conductive material to form an exposed surface of the recess (in 104); lining the exposed surface of the recess with a second seed layer (in 106); and filling the recess with a second conductive material, the second conductive material covering the first conductive material and the second seed layer (in 108).

Figure 2:
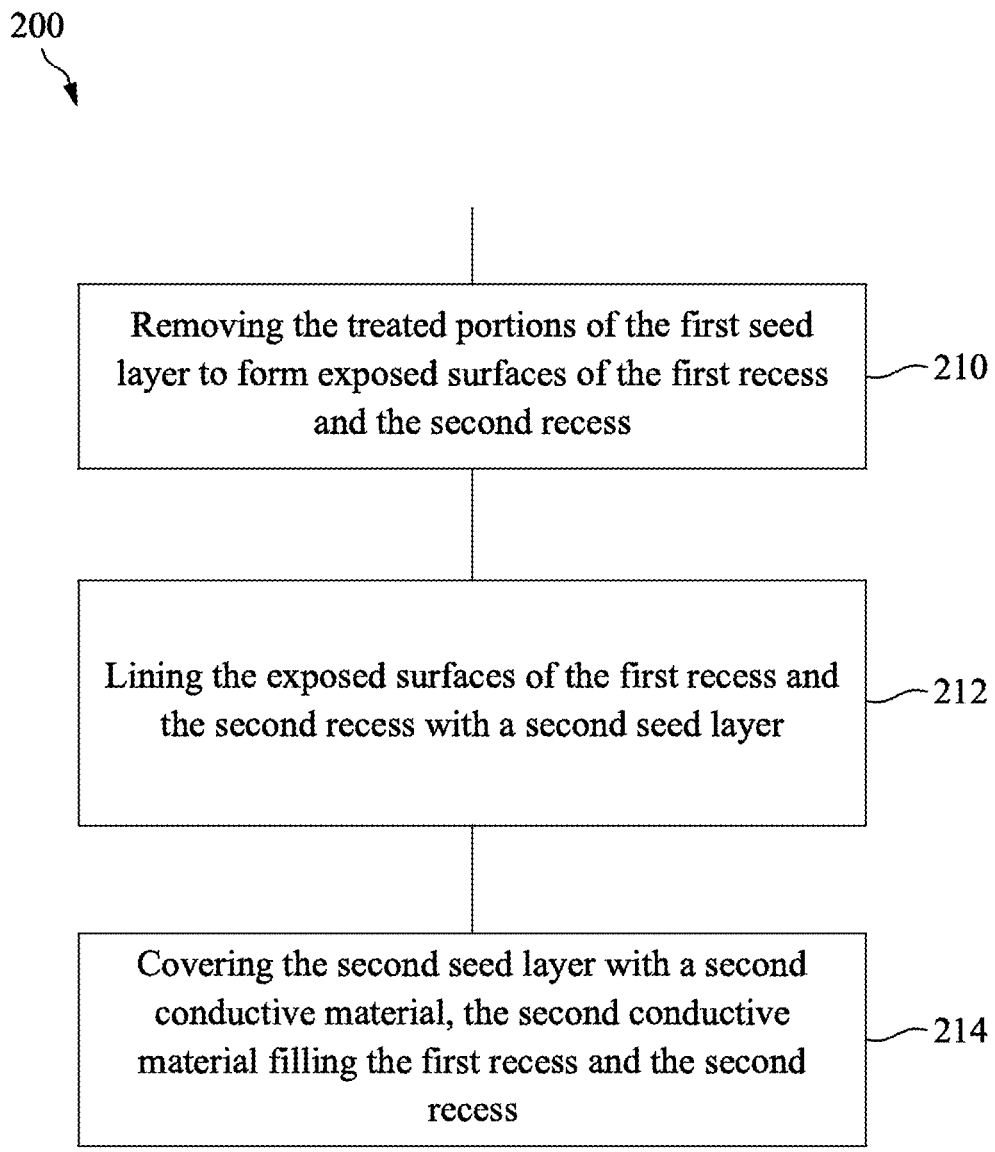

FIG. 2 shows a method 200 of forming a conductive structure (e.g. a contact plug), in accordance with one or more embodiments. The method 200 may include: providing a substrate having a first recess and a second recess formed therein, wherein the first recess extends into the substrate by a first distance and the second recess extends into the substrate by a second distance smaller than the first distance (in 202); lining the first recess and the second recess with a first seed layer (in 204); exposing the first seed layer in the second recess and a portion of the first seed layer in the first recess proximate an opening of the first recess to a treatment plasma to form treated portions of the first seed layer (in 206); partially filling the first recess with a first conductive material, wherein the treated portions of the first seed layer are free from the first conductive material (in 208); removing the treated portions of the first seed layer to form exposed surfaces of the first recess and the second recess (in 210); lining the exposed surfaces of the first recess and the second recess with a second seed layer (in 212); and covering the second seed layer with a second conductive material, the second conductive material filling the first recess and the second recess (in 214).

FIG. 3A to FIG. 3H show a process flow illustrating some of the process steps of the method 100 shown in FIG. 1 and the method 200 shown in FIG. 2, in accordance with one or more embodiments. The process flow illustrated in FIG. 3A to FIG. 3H may, for example, be carried out during manufacture of a conductive structure for contacting (e.g. electrically contacting) an underlying electrical element (e.g. via, conductive line or trace, etc.) and/or an underlying electronic component (e.g., transistor, diode, resistor, capacitor, etc.).

Figure 3A:
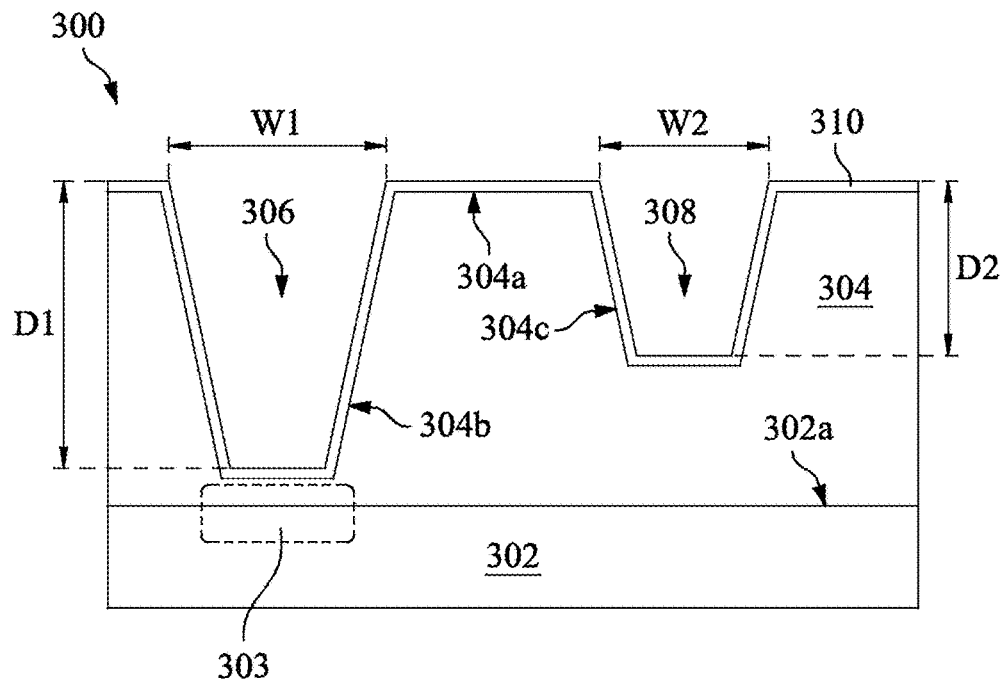
FIG. 3A to FIG. 3H show a process flow illustrating some of the process steps of the methods shown in FIG. 1 and FIG. 2, in accordance with some embodiments.

FIG. 3A shows a substrate 300 including a semiconductor substrate layer 302, an insulating layer 304, a first recess 306, a second recess 308, and a barrier layer 310. The semiconductor substrate layer 302 may include, or may consist of, an elementary semiconductor material (such as silicon or germanium); a compound semiconductor material (including silicon carbide, gallium arsenic, gallium phosphide, indium phosphide, indium arsenide, and/or indium antimonide); an alloy semiconductor material (including SiGe, GaAsP, AlInAs, AlGaAs, GaInAs, GaInP, and/or GaInAsP); or combinations thereof. The semiconductor substrate layer 302 may include, or may be, a semiconductor on insulator (SOI) substrate. The SOI substrate may include a buried oxide (BOX) layer formed by a process such as separation by implanted oxygen (SIMOX), and/or other suitable processes. Further, the semiconductor substrate layer 302 may include an epitaxial layer (epi-layer) that may, for example, be strained for performance enhancement.

The semiconductor substrate layer 302 may include an electrical element and/or an electronic component (shown in phantom in FIG. 3A as reference number 303) formed therein or thereon. For example, the electrical element and/or electronic component 303 may be formed at or near a surface 302a of the semiconductor substrate layer 302 facing the insulating layer 304. The electrical element may include, or may be, at least one of a via, a conductive line, a conductive trace, or the like, while the electronic component may include, or may be, at least one of a transistor, a diode, a resistor, a capacitor, or the like.

The insulating layer 304 may be disposed atop the surface 302a of the semiconductor substrate layer 302. The insulating layer 304 may include, or may consist of, a dielectric material and may be an interlayer dielectric (ILD) layer. The dielectric material of the insulating layer 304 may include, or may be, a low-k dielectric material, for example, with a k value less than or equal to about 3.0, or even less than or equal to about 2.5. The insulating layer 304 may include, or may consist of, phosphosilicate glass (PSG), borophosphosilicate glass (BPSG), fluorosilicate glass (FSG), $SiO_xC_y$, tetraethyl orthosilicate (TEOS) oxide, spin-on-glass, spin-on-polymers, silicon carbon material, compounds thereof, composites thereof, combinations thereof, or the like. The insulating layer 304 may include one or more layers of insulating material. In other words, the insulating layer 304 may include, or may be, a single layer structure (e.g. including one layer of insulating material) or a multilayer structure (e.g. including two or more layers of insulating material). The insulating layer 304 may include one or more electrical elements (e.g. a via, a conductive line, a conductive trace, or the like) formed therein (not shown in FIG. 3A). The insulating layer 304 may be formed atop the semiconductor substrate layer 302 by chemical vapor deposition (CVD), physical vapor deposition (PVD), atomic layer deposition (ALD), a spin-on-dielectric process, combinations thereof, or the like.

After forming the insulating layer 304 atop the semiconductor substrate layer 302, a first trench 304b and a second trench 304c (which may be shallower than the first trench 304b) may be formed in the insulating layer 304, e.g. by an etch process. The etch process may include, or may be, at least one of a wet etch process or a dry etch process (e.g. a plasma etch process). In forming the first trench 304b and the second trench 304c, a patterned etch mask (not illustrated in FIG. 3A) may first be formed over a portion of a surface 304a of the insulating layer 304 facing away from the semiconductor substrate layer 302. The patterned etch mask may be formed by coating a masking material (e.g. a photoresist) over the surface 304a of the insulating layer 304, and patterning the masking material to form the patterned etch mask. Patterning the masking material may include, or may consist of, a lithographic process (e.g. a photo-lithographic process). Thereafter, the etch process may be applied in cooperation with the patterned etch mask to form the first trench 304b and the second trench 304c in the insulating layer 304. The surface 304a of the insulating layer 304 and surfaces of the newly formed first trench 304b and second trench 304c may be cleaned after the etch process. As an example, at least one of an inert gas sputtering process (e.g. argon sputter) or a plasma based cleaning process (e.g. a SiCoNi pre-clean process) may be used to clean the surfaces of the first trench 304b, the second trench 304c, and the insulating layer 304.

The barrier layer 310 may thereafter be formed over the cleaned surfaces of the first trench 304b and the second trench 304c as well as over the cleaned surface 304a of the insulating layer 304. The surfaces of the barrier layer 310 in the first trench 304b may define the surfaces of the first recess 306. Similarly, the surfaces of the barrier layer 310 in the second trench 304c may define the surfaces of the second recess 308. The barrier layer 310 may prevent conductive material subsequently formed in the first recess 306 and the second recess 308 from diffusing into the insulating layer 304.

The barrier layer 310 may be formed by at least one of PVD, CVD, ALD, or the like. Forming the barrier layer 310 may also include a thermal process (e.g. an annealing process), which may, as an example, be performed at a temperature in a range from about 400 degrees Celsius to about 650 degrees Celsius, e.g. in a range from about 450 degrees Celsius to about 600 degrees Celsius, although other temperature ranges may be possible as well.

The barrier layer 310 may have a thickness in the range from about 1 nanometer to about 20 nanometers, for example in the range from about 3 nanometers to about 15 nanometers, although other thickness may be possible as well. The barrier layer 310 may include, or may consist of, tantalum nitride (TaN), tantalum (Ta), ruthenium (Ru), combinations thereof, or the like. While these are the commonly considered materials, other barrier layer materials can also be used such as titanium (Ti), tungsten (W), zirconium (Zr), hafnium (Hf), molybdenum (Mo), niobium (Nb), vanadium (V), ruthenium (Ru), iridium (Ir), platinum (Pt), and chromium (Cr), as examples.

The barrier layer 310 may include one or more layers of barrier material. In other words, the barrier layer 310 may include, or may be, a single layer structure (e.g. including one layer of barrier material) or a multilayer structure (e.g. including two or more layers of barrier material). As an example, the barrier layer 310 may include a first layer (e.g. including Ti and having a thickness of, e.g., about 2 nanometers) proximate the insulating layer 304 and a second layer (e.g. including TiN and having a thickness of, e.g., about 2 nanometers) formed over the first layer.

A first width W1 of the first recess 306 may be measured as the widest lateral extent of the first recess 306. Similarly, a second width W2 of the second recess 308 may be measured as the widest lateral extent of the second recess 308. As an example, the first width W1 may be measured as the distance between opposing surfaces of the barrier layer 310 at an opening of the first recess 306, as shown in the example of FIG. 3A. A similar way of measuring the second width W2 is illustrated in the example of FIG. 3A. The first width W1 and the second width W2 may each be in a range from about 10 nanometers to about 100 nanometers, for example in a range from about 20 nanometers to about 50 nanometers, for example about 25 nanometers, although other values may be possible as well in accordance with other embodiments.

The first recess 306 may extend into the substrate 300 by a first distance D1 and the second recess 308 may extend into the substrate 300 by a second distance D2, which may be smaller than the first distance D1. The first distance D1 and the second distance D2 may, as an example, be referred to as a depth of the first recess 306 and a depth of the second recess 308, respectively. As shown in FIG. 3A, the first distance D1 may, for example, be measured as a distance (e.g. perpendicular distance) between a surface of the barrier layer 310 outside the first recess 306 and a surface of the barrier layer 310 at a floor of the first recess 306. A similar way of measuring the second distance D2 is illustrated in the example of FIG. 3A.

In the example shown in FIG. 3A, the first recess 306 extends fully through the insulating layer 304 of the substrate 300, while the second recess 308 extends partially through the insulating layer 304 of the substrate 300. However, in another embodiment, both the first recess 306 and the second recess 308 may extend partially through the insulating layer 304. The first distance D1 may be in the range from about 50 nanometers to about 300 nanometers, for example in the range from about 100 nanometers to about 200 nanometers, for example about 150 nanometers, although other values may be possible as well in accordance with other embodiments. The second distance D2 may be in the range from about 50 nanometers to about 100 nanometers, for example about 80 nanometers, although other values may be possible as well in accordance with other embodiments.

A conductive structure, e.g. a contact plug, may subsequently be formed in the first recess 306 and the second recess 308, e.g. to contact underlying electrical elements (e.g. vias, conductive lines or traces, etc.) and/or underlying electronic components (e.g., transistors, diodes, resistors, capacitors, etc.). FIG. 3B to FIG. 3H illustrates some of the process steps of forming a conductive structure in the first recess 306 and the second recess 308 shown in FIG. 3A.

Figure 3B:
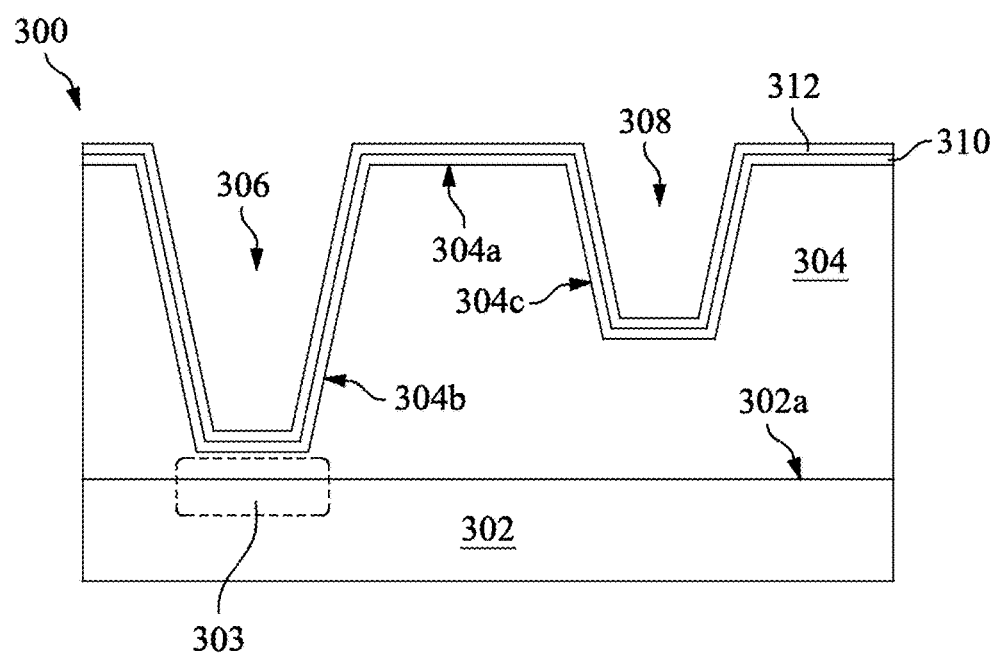

As shown in FIG. 3B, a first seed layer 312 may be formed in the first recess 306 and the second recess 308, lining the surfaces thereof. The first seed layer 312 is also formed over the barrier layer 310 disposed atop the surface 304a of the insulating layer 304. The first seed layer 312 is a thin layer of conductive material that aids in the formation of a thicker layer during subsequent processing steps (e.g. in the formation of a first conductive material in the first recess 306, as shown in FIG. 3D). The first seed layer 312 may be formed by at least one of a pulsed nucleation layer (PNL) process or an ALD process, although other processes may be possible as well. The process for forming the first seed layer 312 may be performed at a temperature in a range from about 200 degrees Celsius to about 500 degrees Celsius, e.g. about 400 degrees Celsius. In an embodiment, the first seed layer 312 may include, or may consist of, tungsten. In other embodiments, other conductive materials may be possible, e.g. copper, titanium, tantalum, chromium, platinum, silver, gold, combinations thereof, or the like. The first seed layer 312 may have a thickness in a range from about 1 nanometer to about 5 nanometers (e.g. about 3 nanometers), although other thicknesses may be possible as well.

Figure 3C:
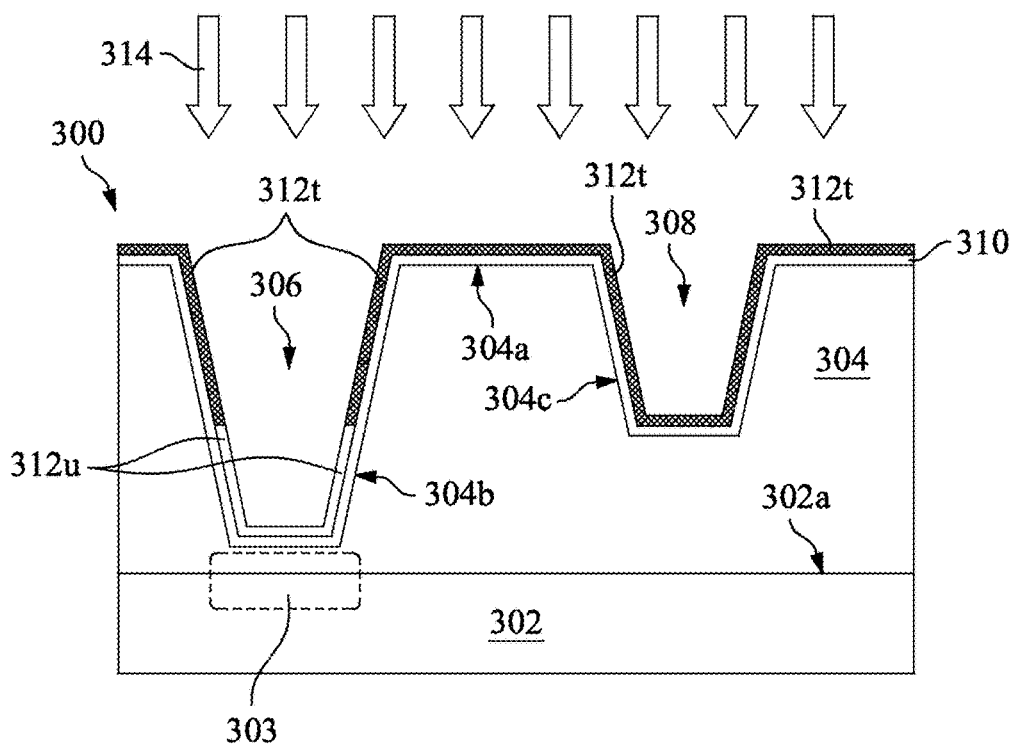
Figure 3D:
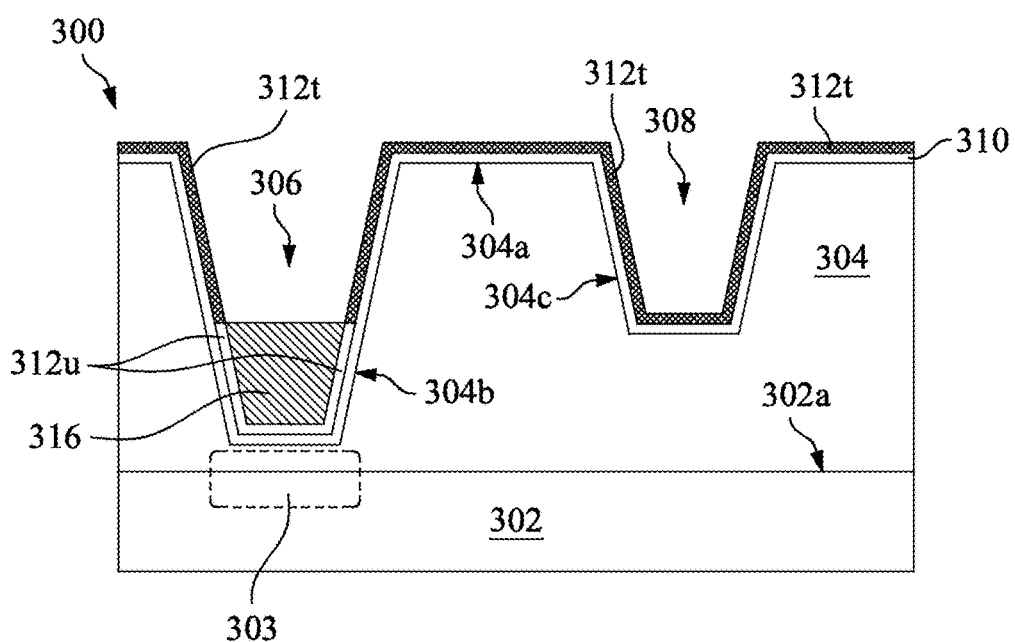

Thereafter, portions of the first seed layer 312 may be exposed to a treatment process 314 to form treated portions of the first seed layer 312t, as shown in FIG. 3C. Portions of the first seed layer 312 not exposed to the treatment process 314 may be referred to as untreated portions of the first seed layer 312u. Treated portions of the first seed layer 312t may include portions of the first seed layer 312 within the second recess 308, portions of the first seed layer 312 disposed over the surface 304a of the insulating layer 304, and a portion of the first seed layer 312 within the first recess 306 proximate the opening of the first recess 306, as shown in the example of FIG. 3C.

The portions of the first seed layer 312 exposed to the treatment process 314 may depend at least in part on the geometry of the first recess 306 and the second recess 308. For example, the second recess 308 shown in FIG. 3C is shallower than the first recess 306. Accordingly, the treatment process 314 may be able to penetrate the entire second distance D2 of the second recess 308, thus treating all portions of the first seed layer 312 dispose in the second recess 308. On the other hand, the first recess 306 may extend deeper into the substrate 300. Accordingly, the treatment process 314 may penetrate only a portion (e.g. an upper portion) of the first recess 306, thus treating the portion of the first seed layer 312 within the first recess 306 proximate the opening of the first recess 306.

The treatment process 314 may inhibit or suppress growth, deposition, or nucleation of conductive material at the treated portions of the first seed layer 312t. This inhibition or suppression may be achieved by various mechanisms. In one mechanism, an activated species may passivate exposed portions of the first seed layer 312. For example, the activated species may be a treatment plasma. Stated in another way, the treatment process 314 may be a plasma treatment process. The treatment plasma may include, or may be, at least one of a nitrogen containing plasma, a hydrogen containing plasma, an oxygen containing plasma, or a hydrocarbon containing plasma. The degree to which the treatment process 314 inhibits growth, deposition, or nucleation of conductive material at the treated portions of the first seed layer 312t may depend, at least in part, on the composition of the treatment plasma. As an example, nitrogen may have a stronger inhibiting effect than hydrogen, and adjustment of the relative concentrations of nitrogen and hydrogen in the treatment plasma can vary the degree to which growth, deposition, or nucleation of conductive material is suppressed or inhibited at the treated portions of the first seed layer 312t. In an embodiment where the treatment plasma includes, or consists of, nitrogen (e.g. $N_2$), the treatment plasma may be flowed at a rate in a range from about 1 standard cubic centimeters per minute (sccm) to about 20 sccm. In this embodiment, the treatment process 314 may performed at a temperature in a range from about 300 degrees Celsius to about 400 degrees Celsius and at a pressure ranging from about 0.6 Torrs to about 2 Torrs, although other temperatures and pressures may be possible as well. In another mechanism, inhibition may be achieved by a chemical reaction between an activated species and the exposed surfaces of the first seed layer 312. The chemical reaction may form a thin layer of a compound material (e.g. tungsten nitride or tungsten carbide). The activated species may be formed by plasma generation and/or exposure to ultraviolet (UV) radiation, as examples, and may include atomic species, radical species, and ionic species. In yet another mechanism, inhibition may be achieved by a surface effect such as adsorption that passivates the surface without forming a layer of a compound material.

The treatment process 314 also may have an effect of changing a phase of the material or materials in the treated portions of the first seed layer 312t. As an example, the first seed layer 312 shown in FIG. 3B may include, or may consist of, tungsten at a first phase known as alpha tungsten. After the treatment process 314 shown in FIG. 3C, the phase of the tungsten in the treated portions of the first seed layer 312t may be changed from the first phase (alpha tungsten) to a second phase known as beta tungsten. The phase of the tungsten in the untreated portions of the first seed layer 312u is unchanged and remains as alpha tungsten. The change in the phase of the tungsten at the treated portions of the first seed layer 312t may also result in a change in a resistivity of the tungsten. For example, alpha tungsten (in the untreated portions of the first seed layer 312u) has a resistivity in a range from about 5 micro-ohm centimeters to about 6 micro-ohm centimeters at about 300 Kelvin, while beta tungsten (in the treated portions of the first seed layer 312t) has a resistivity greater than about 40 micro-ohm centimeters at about 300 Kelvin. A conductive material that is subsequently formed in the substrate 300 may be preferentially or selectively formed over the untreated portions of the first seed layer 312u and not over the treated portions of the first seed layer 312t.

As shown in FIG. 3D, the first recess 306 may be partially filled with a first conductive material 316, which may include, or may consist of, similar materials as the first seed layer 312. The first conductive material 316 may cover the untreated portions of the first seed layer 312u. Since growth, deposition, or nucleation of conductive material is suppressed or inhibited at the treated portions of the first seed layer 312t, the first conductive material 316 is not formed over the treated portions of the first seed layer 312t. Accordingly, the treated portions of the first seed layer 312t may be free from the first conductive material 316. The first conductive material 316 may also be referred to as first bulk conductive material, which may have a lower resistivity than the treated portions of the first seed layer 312t.

The first conductive material 316 may be formed within the first recess 306 by a fill process. In an embodiment, the fill process may be at least one of a PVD process or a CVD process. The fill process may be a bottom-up fill process, which may be a consequence of the treatment process 314. For example, besides inhibiting formation of conductive material at the treated portions of the first seed layer 312t, the treatment process 314 (shown in FIG. 3C) may cause conductive material formed over the untreated portions of the first seed layer 312u to proceed as a bottom-up fill process as opposed to a conformal fill process. As applied to the example shown in FIG. 3D, in the bottom-up fill process, the first conductive material 316 may be initially formed at the floor of the first recess 306 as a thin layer which increases in thickness towards the opening of the first recess 306 until the untreated portions of the first seed layer 312u are covered by the first conductive material 316. This bottom-up fill process prevents gaps, voids, or seam holes from forming within the first conductive material 316, which are features often associated with a conformal fill process. The fill process may performed at a temperature in a range from about 300 degrees Celsius to about 450 degrees Celsius and at a pressure ranging from about 100 Torrs to about 500 Torrs (e.g. about 300 Torrs), although other temperatures and pressures may be possible as well.

As described above, even though the treated portions of the first seed layer 312t and the untreated portions of the first seed layer 312u may include, or may consist of, similar materials, a phase of the materials therein may be different. In the event that conductive material (e.g. a second seed layer) is formed over the treated portions of the first seed layer 312t, the treated portions of the first seed layer 312t may induce a change in a phase of the material of the conductive material (e.g. second seed layer). Specifically, the phase of the material of the conductive material may be changed from its original low resistivity phase to the high resistivity phase of the material in the treated portions of the first seed layer 312t. Therefore, retaining the treated portions of the first seed layer 312t can adversely affect a contact resistance of conductive structures formed in the substrate 300.

Figure 3E:
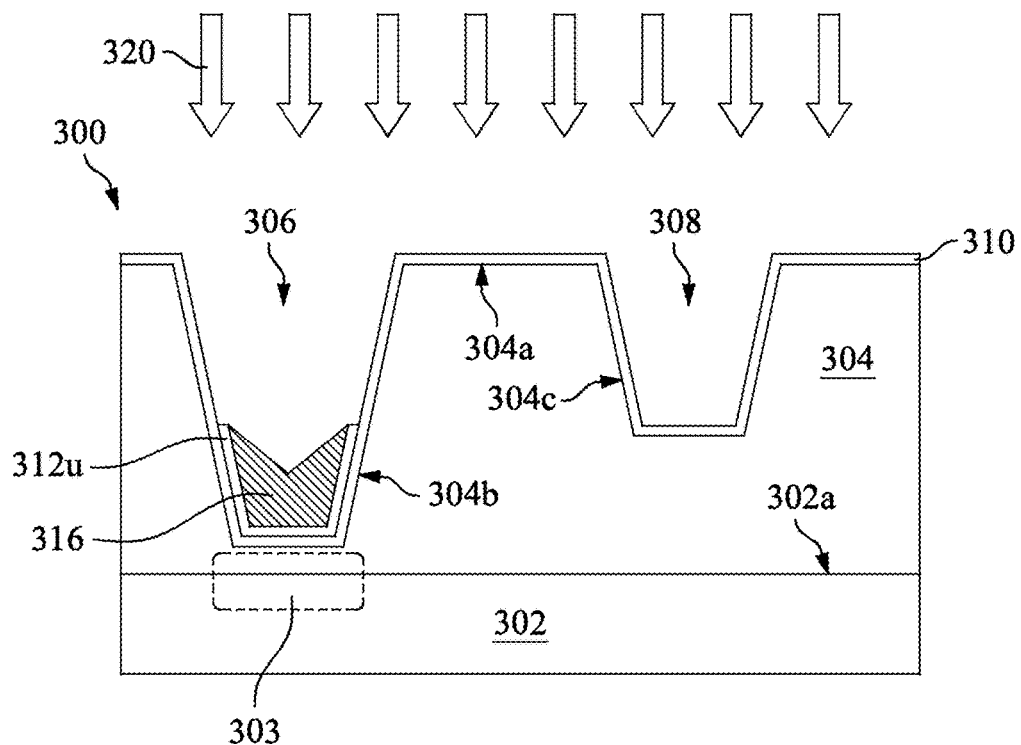

Consequently, as shown in FIG. 3E, the treated portions of the first seed layer 312t may be removed (e.g. by an etch process 320) to expose surfaces of the first recess 306 and the second recess 308 (e.g. to expose surfaces of the barrier layer 310, which define the surfaces of the first recess 306 and the second recess 308). In addition, a surface of the first conductive material 316 facing the opening of the first recess 306 may be etched by the etch process 320, thereby removing a portion of the first conductive material 316 proximate the opening of the first recess 306.

In an embodiment, the etch process 320 may be a dry etch process (e.g. a plasma etch process). An etchant used in the etch process 320 may include, or may consist of, a halogen containing etchant. The composition of the etchant may depend, at least in part, on the material or materials of the treated portions of the first seed layer 312t. For example, in an embodiment where the treated portions of the first seed layer 312t include, or consist of, tungsten (e.g. beta tungsten), the etchant used in the etch process 320 may be a fluorine containing etchant, e.g. a fluorine containing plasma (e.g. $NF_3$ plasma). The etchant used in the etch process 320 may be flowed at a rate in a range from about 50 sccm to about 200 sccm, although other flow rates may be possible as well. As a result of the etch process 320 shown in FIG. 3E, portions of the substrate 300 having high resistivity are removed.

Figure 3F:
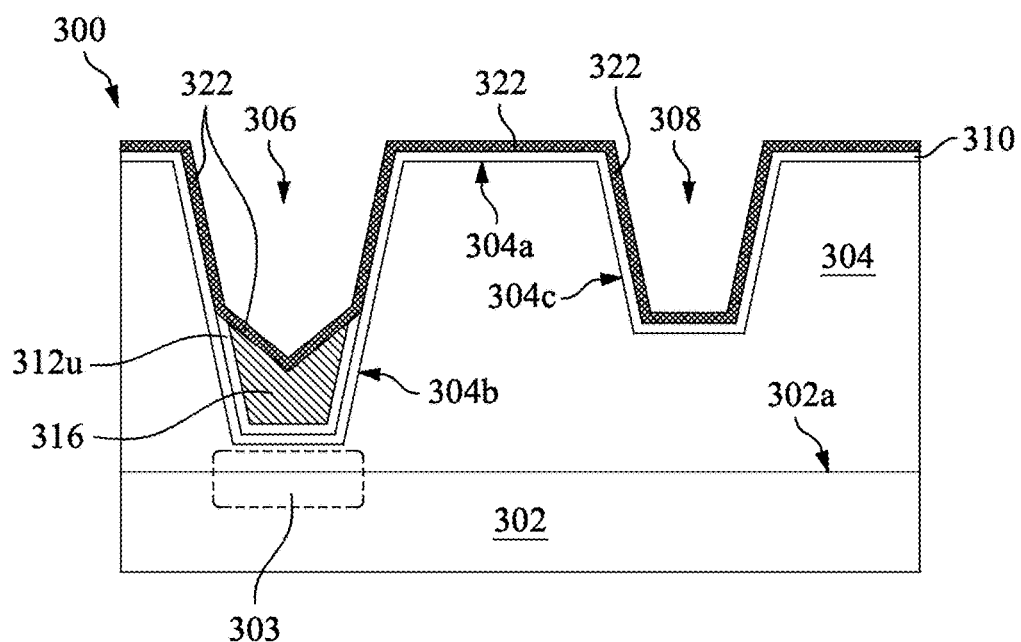
Figure 3G:
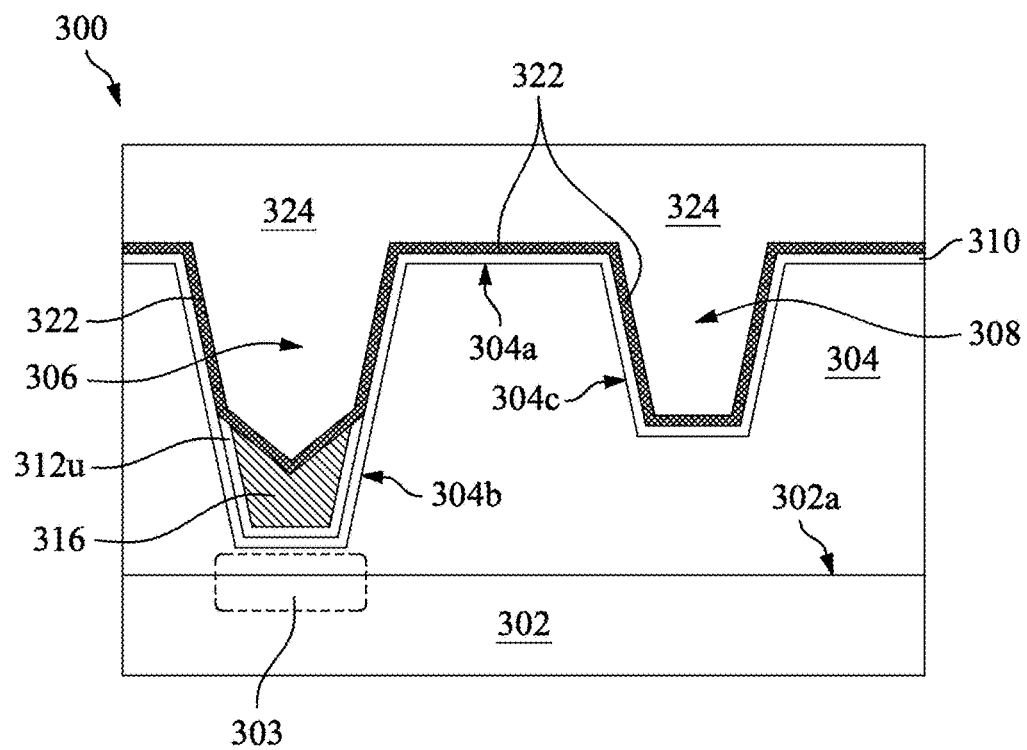

As shown in FIG. 3F, a second seed layer 322 may be formed in the first recess 306 and the second recess 308, lining the exposed surfaces thereof. The second seed layer 322 is also formed atop the barrier layer 310 disposed over the surface 304a of the insulating layer 304 and over the surface of the first conductive material 316 facing the opening of the first recess 306. Similar to the first seed layer 312, the second seed layer 322 is a thin layer of conductive material that aids in the formation of a thicker layer during subsequent processing steps (e.g. in the formation of a second conductive material in the first recess 306 and the second recess 308, as shown in FIG. 3G). The second seed layer 322 may include, or may consist of, similar materials as the first seed layer 312, and the materials of the second seed layer 322 may be at a low resistivity phase (e.g. alpha tungsten). The second seed layer 322 may have a thickness in a range from about 1 nanometer to about 8 nanometers (e.g. about 5 nanometers). The second seed layer 322 may be formed by similar processes as the first seed layer 312, although the process for forming the second seed layer 322 may be performed at a temperature greater than or equal to about 200 degrees Celsius, e.g. in a range from about 300 degrees Celsius to about 400 degrees Celsius and at a pressure in the range from about 2 Torrs to about 10 Torrs (e.g. about 5 Torrs).

As shown in FIG. 3G, the first recess 306 and the second recess 308 having the second seed layer 322 formed therein are overfilled will a second conductive material 324. In the example shown in FIG. 3G, the second conductive material 324 covers the first conductive material 316 and the second seed layer 322 within the first recess 306 and the second recess 308. In addition, the second conductive material 324 covers the second seed layer 322 disposed over the surface 304a of the insulating layer 304. The second conductive material 324 may be formed by a bottom-up fill process or a conformal process. In the example where formation of the second conductive material 324 is a conformal process, gaps, voids, or seam hole are prevented from forming by virtue of the shallower depth in the first recess 306 and the second recess 308 that needs to be filled with the second conductive material 324. The second conductive material 324 may include, or may consist of, similar materials as the first conductive material 316. The second conductive material 324 may also be referred to as second bulk conductive material, which may have a lower resistivity than the treated portions of the previously removed first seed layer 312t.

Figure 3H:
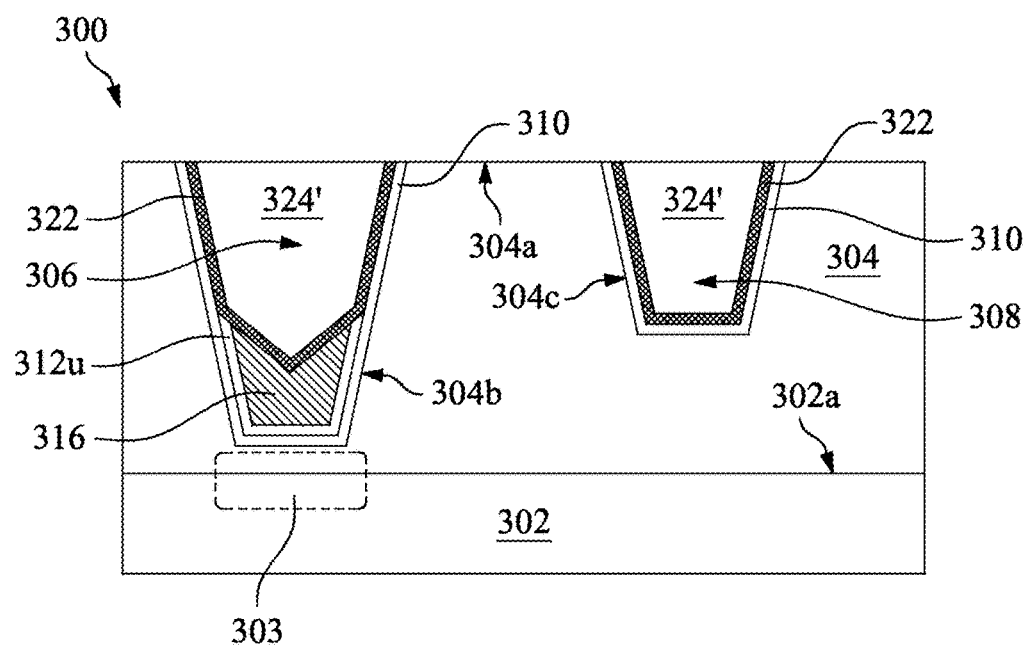

The second conductive material 324 is subsequently planarized to form a planarized second conductive material 324', as shown in FIG. 3H. The planarization may be performed by a chemical mechanical polish (CMP) process which may remove excess portions of the second conductive material 324 disposed outside the first recess 306 and the second recess 308. In addition to removing excess portions of the second conductive material 324, portions of the second seed layer 322 and the barrier layer 310 disposed outside the first recess 306 and the second recess 308 are also removed, as shown in the example of FIG. 3H.

Using the process steps shown in FIG. 3A to FIG. 3H, a conductive structure (e.g. a contact plug, e.g. a source/drain contact plug) may be formed in each of the first recess 306 and the second recess 308. The conductive structure may contact (e.g. electrically contacting) an underlying electrical element (e.g. via, conductive line or trace, etc.) and/or an underlying electronic component (e.g., transistor, diode, resistor, capacitor, etc.) that may be formed in the semiconductor substrate layer 302 and/or the insulating layer 304.

Since the first recess 306 and the second recess 308 have different depths, the conductive structures formed therein have different critical dimensions and depths. Accordingly, the process steps shown in FIG. 3A to FIG. 3H may be used to manufacture conductive structures of varying critical dimensions and depths. Furthermore, an effect provided by the process steps shown in FIG. 3A to FIG. 3H is that gaps, voids, or seam holes are prevented from forming within the conductive structures formed in the first recess 306 and the second recess 308. In a conventional process flow, the second seed layer 322 may be formed over the treated portion of the first seed layer 312t and the second conductive material 324 may subsequently be formed over the second seed layer 322. However, in the process steps shown in FIG. 3A to FIG. 3H, the treated portion of the first seed layer 312t is removed. By removing the treated portion of the first seed layer 312t, the volume that would have been occupied by the treated portion of the first seed layer 312t is now occupied by the second bulk conductive material having lower resistivity. Accordingly, the resistivity of the conductive structures formed in the first recess 306 and the second recess 308 is reduced. Even further, changes in phase of a conductive material from a low resistivity phase to a high resistivity phase are avoided by the removal of the treated portion of the first seed layer 312t, thus preventing any increase in the resistivity of the conductive structures formed in the first recess 306 and the second recess 308.

Figure 4A:
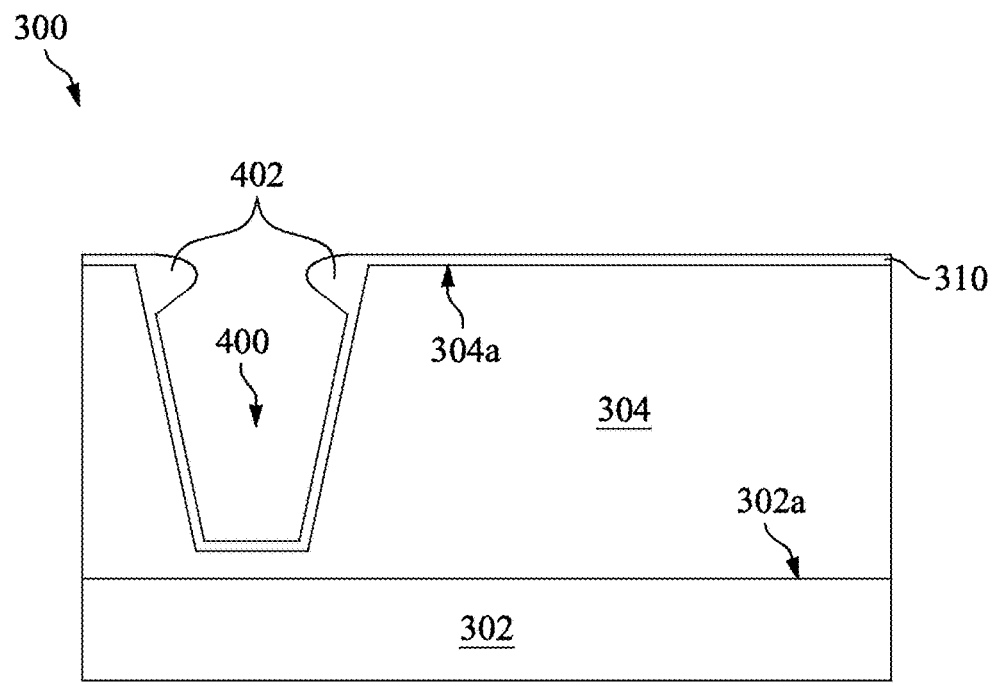
FIG. 4A to FIG. 4H show a process flow illustrating some of the process steps of a method of forming a conductive structure in a recess having an overhang, in accordance with some embodiments.

FIG. 4A to FIG. 4H show a process flow illustrating some of the process steps of the method 100 shown in FIG. 1 and the method 200 shown in FIG. 2, in accordance with one or more embodiments. FIG. 4A shows the substrate 300 including the semiconductor substrate layer 302, the insulating layer 304, the barrier layer 310 and a third recess 400. In comparison to the first recess 306 and the second recess 308, the third recess 400 may have an overhang 402 such that the barrier layer 310 is thicker near the opening of the third recess 400 than inside the third recess 400. Even so, the process steps for forming a conductive structure within the third recess 400 may proceed in a similar manner as described above in respect of FIG. 3A to FIG. 3H.

Figure 4B:
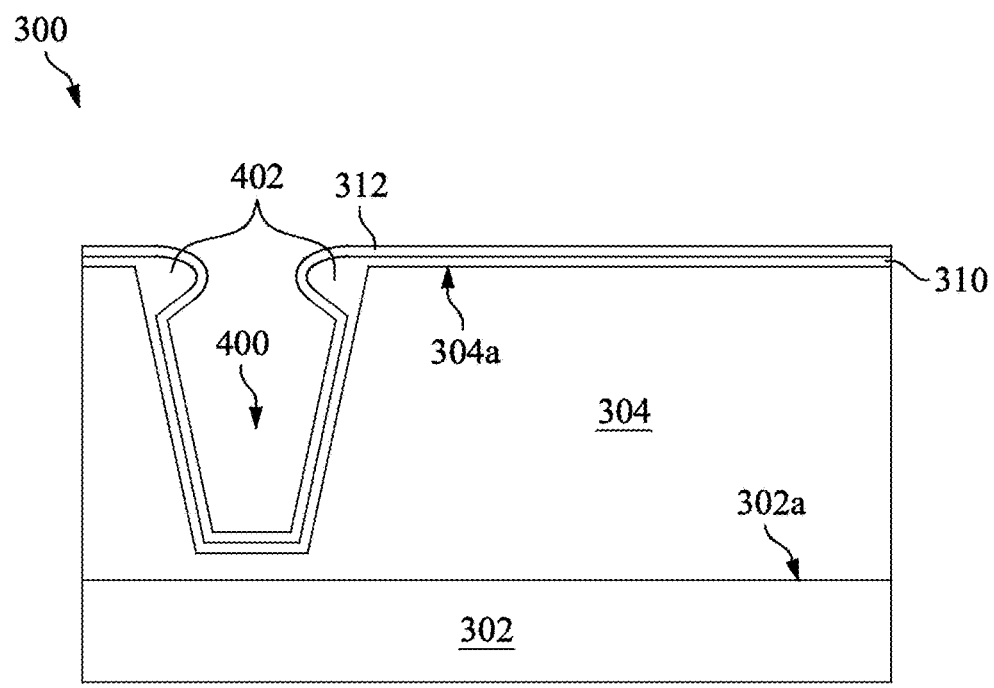
Figure 4C:
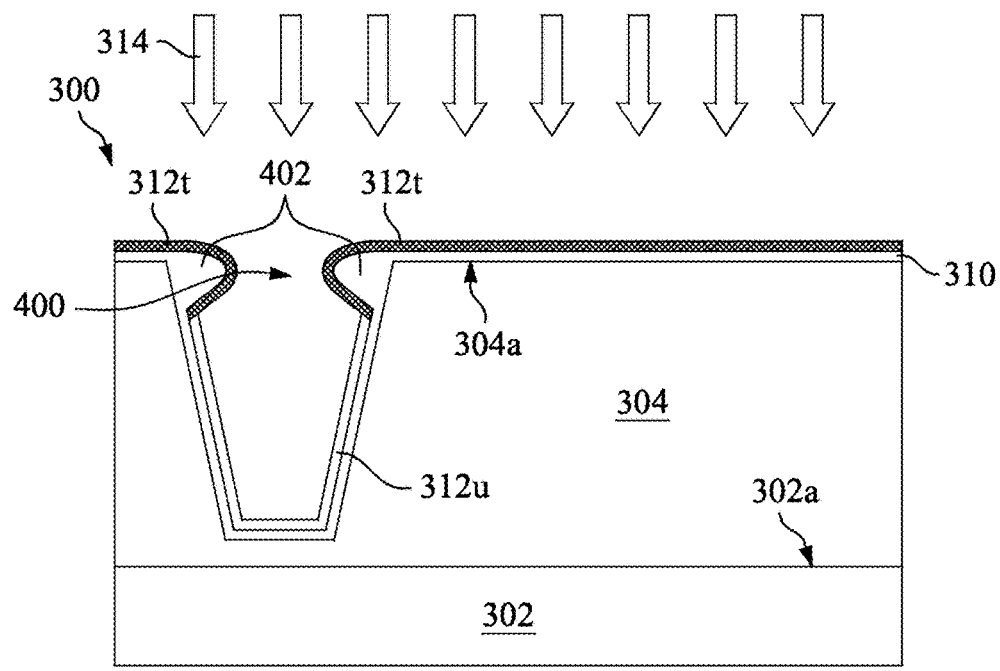

As shown in FIG. 4B, the first seed layer 312 may line the exposed surfaces of the barrier layer 310. As shown in FIG. 4C, portions of the first seed layer 312 may be exposed to the treatment process 314 to form treated portions of the first seed layer 312t. Portions of the first seed layer 312 not exposed to the treatment process 314 may be referred to as untreated portions of the first seed layer 312u. Portions of the first seed layer 312 exposed to the treatment process 314 may include, or may be, portions of the first seed layer 312 disposed over the surface 304a of the insulating layer 304 and portions of the first seed layer 312 disposed over the overhang 402. Portions of the first seed layer 312 on the angled sidewalls of the third recess 400 may be left untreated.

Figure 4D:
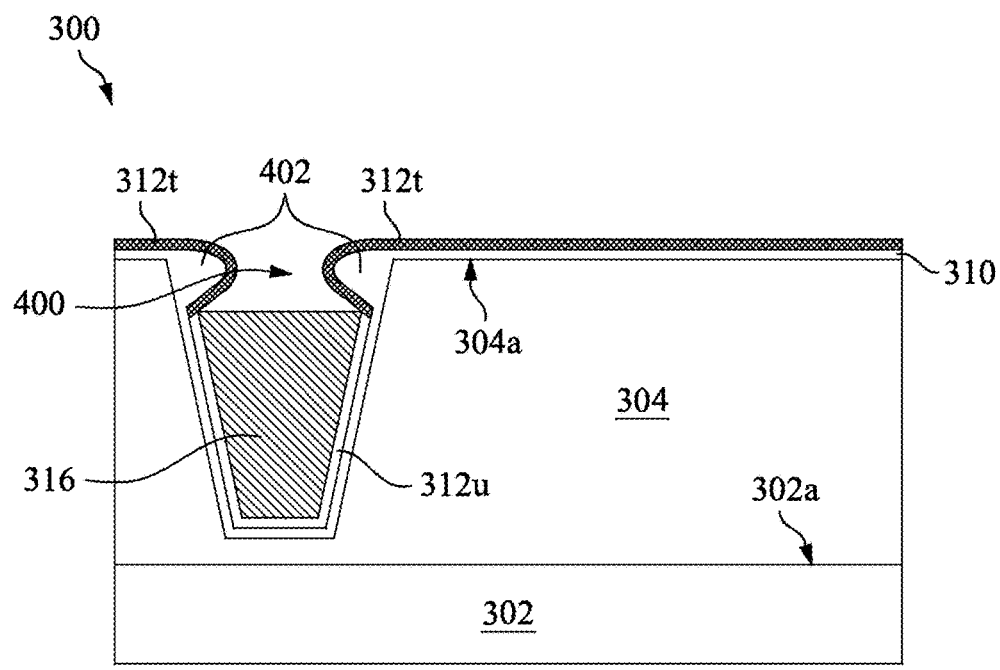

As shown in FIG. 4D, the first conductive material 316 may be formed in the third recess 400 over the untreated portions of the first seed layer 312u. Despite the overhang 402, gaps, voids, or seam holes are prevented from forming in the first conductive material 316 due to the treatment process 314, which allows the filling of the third recess 400 to proceed in a bottom-up manner as described above.

Figure 4E:
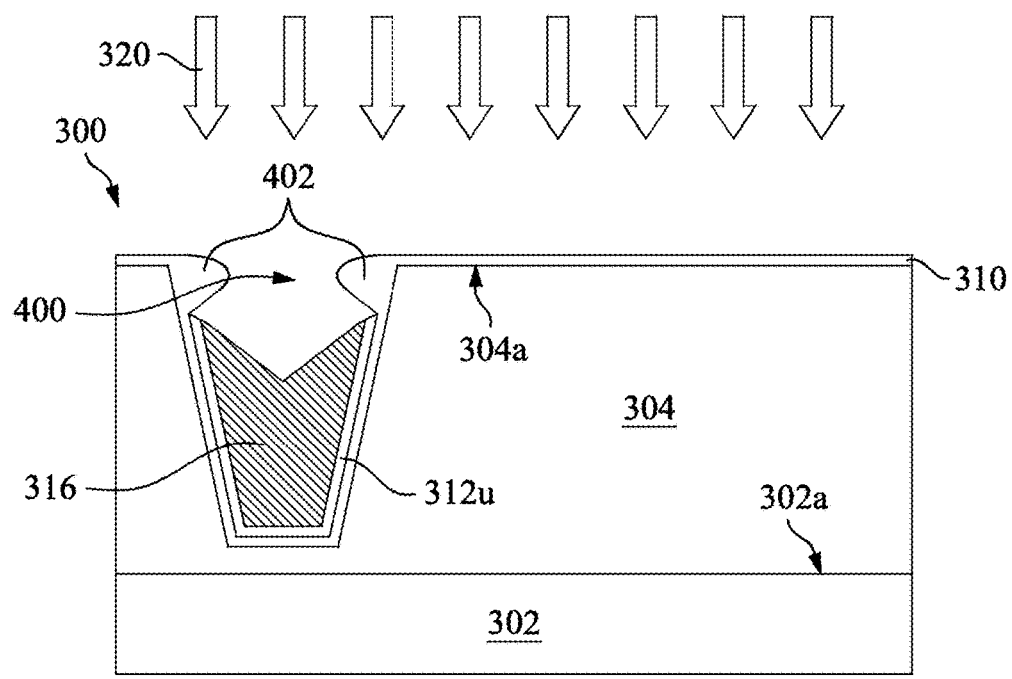
Figure 4F:
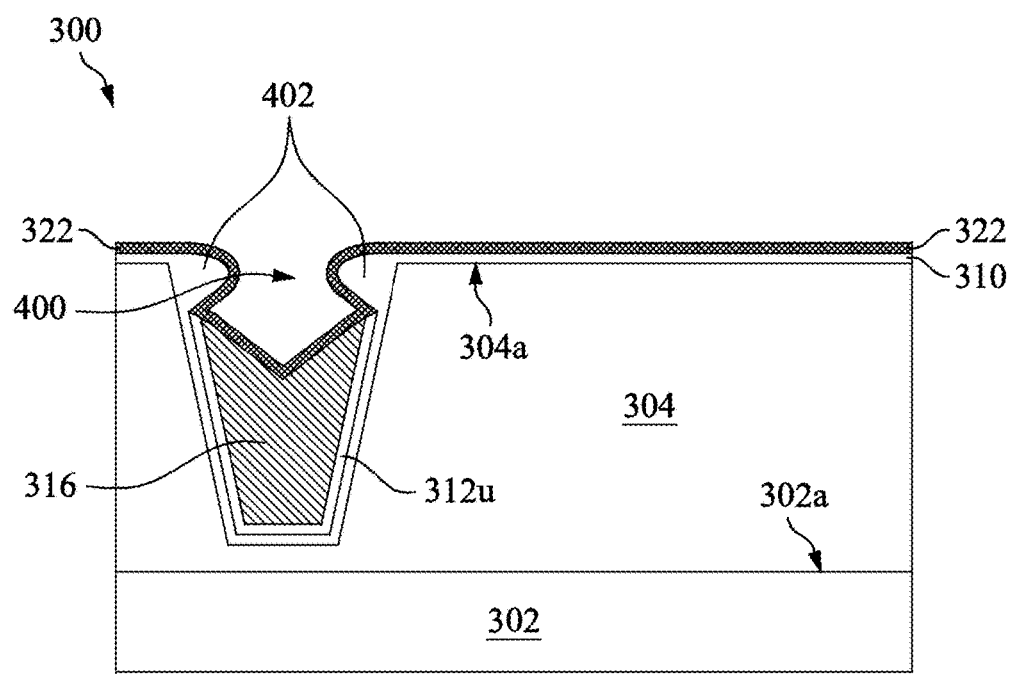

As shown in FIG. 4E, the treated portions of the first seed layer 312t over the surface 304a of the insulating layer 304 may be removed (e.g. by the etch process 320). Portions of the treated portions of the first seed layer 312t at the overhang 402 may likewise be removed. In addition, the etch process 320 may remove portions of the overhang 402, thus enlarging an opening of the third recess 400. This may have an advantageous effect of allowing easier deposition or formation of material within the third recess 400. For example, as shown in FIG. 4F, the second seed layer 322 may be more easily formed in the third recess 400 due to the enlarged opening of the third recess 400. The second seed layer 322 lines the exposed surfaces of the third recess 400, the surface of the first conductive material 316 facing the opening of the third recess 400, the overhang 402, and the barrier layer 310 disposed over the surface 304a of the insulating layer.

Figure 4G:
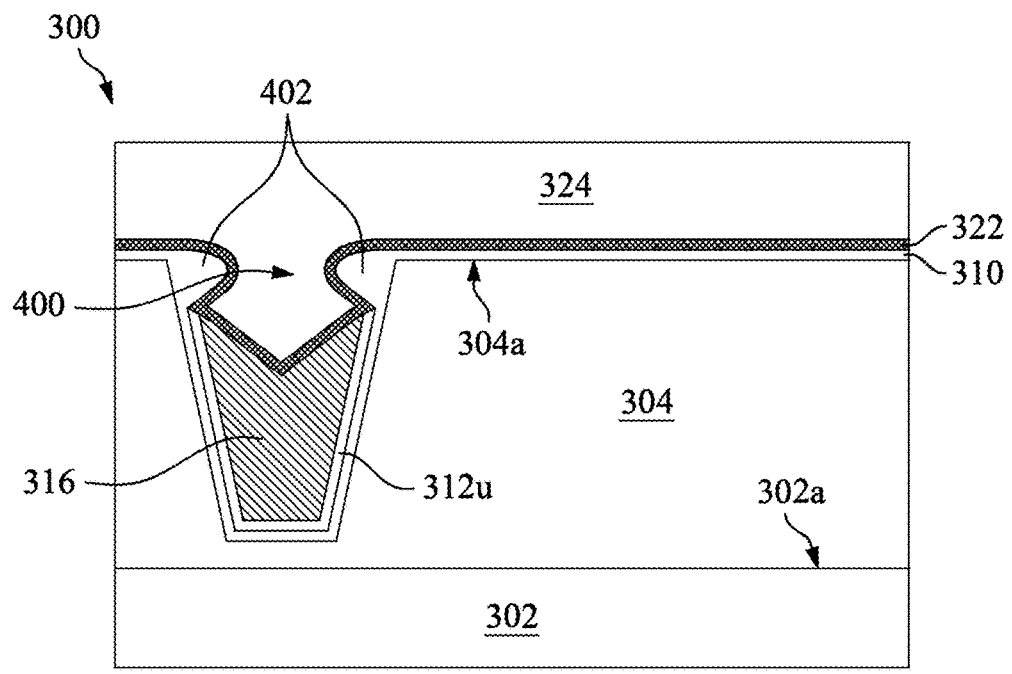

As shown in FIG. 4G, the third recess 400 having the second seed layer 322 formed therein is overfilled will the second conductive material 324. In the example shown in FIG. 4G, the second conductive material 324 covers the first conductive material 316 and the second seed layer 322 within the third recess 400. In addition, the second conductive material 324 covers the second seed layer 322 disposed outside the third recess 400.

Figure 4H:
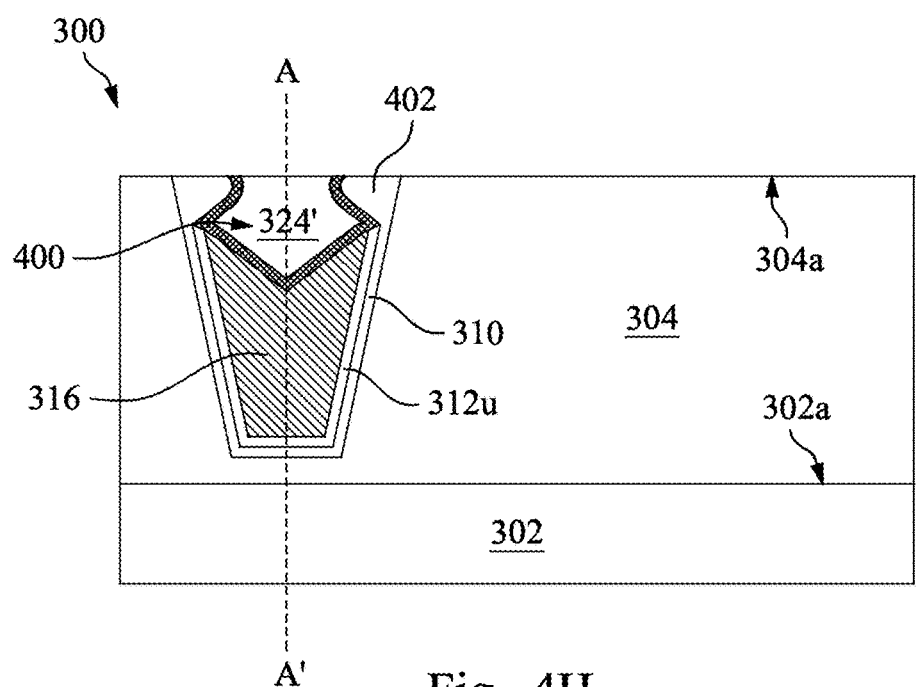

The second conductive material 324 is subsequently planarized to form the planarized second conductive material 324', as shown in FIG. 4H. As described above, the planarization may be performed by a CMP process which may remove excess portions of the second conductive material 324 disposed outside third recess 400 as well as portions of the second seed layer 322 and the barrier layer 310 disposed outside the third recess 400. In doing so, a portion of the overhang 402 may be removed as well, as shown in FIG. 4H.

Using the process steps shown in FIG. 4A to FIG. 4H, a conductive structure (e.g. a contact plug) may be formed in the third recess 400 having the overhang 402. Similar to the process steps shown in FIG. 3A to FIG. 3H, an effect provided by the process steps shown in FIG. 4A to FIG. 4H is that gaps, voids, or seam holes are prevented from forming within the conductive structures formed in the third recess 400. In a conventional process flow, the second seed layer 322 may be formed over the treated portion of the first seed layer 312*t* and the second conductive material 324 may subsequently be formed over the second seed layer 322. However, in the process steps shown in FIG. 4A to FIG. 4H, the treated portion of the first seed layer 312*t* is removed. By removing the treated portion of the first seed layer 312*t*, the volume that would have been occupied by the treated portion of the first seed layer 312*t* is now occupied by the second bulk conductive material having lower resistivity. Accordingly, the resistivity of the conductive structures formed in the third recess 400 is reduced. Even further, changes in phase of a conductive material from a low resistivity phase to a high resistivity phase are avoided by the removal of the treated portion of the first seed layer 312*t*, thus preventing any increase in the resistivity of the conductive structures formed in the third recess 400.

Figure 5:
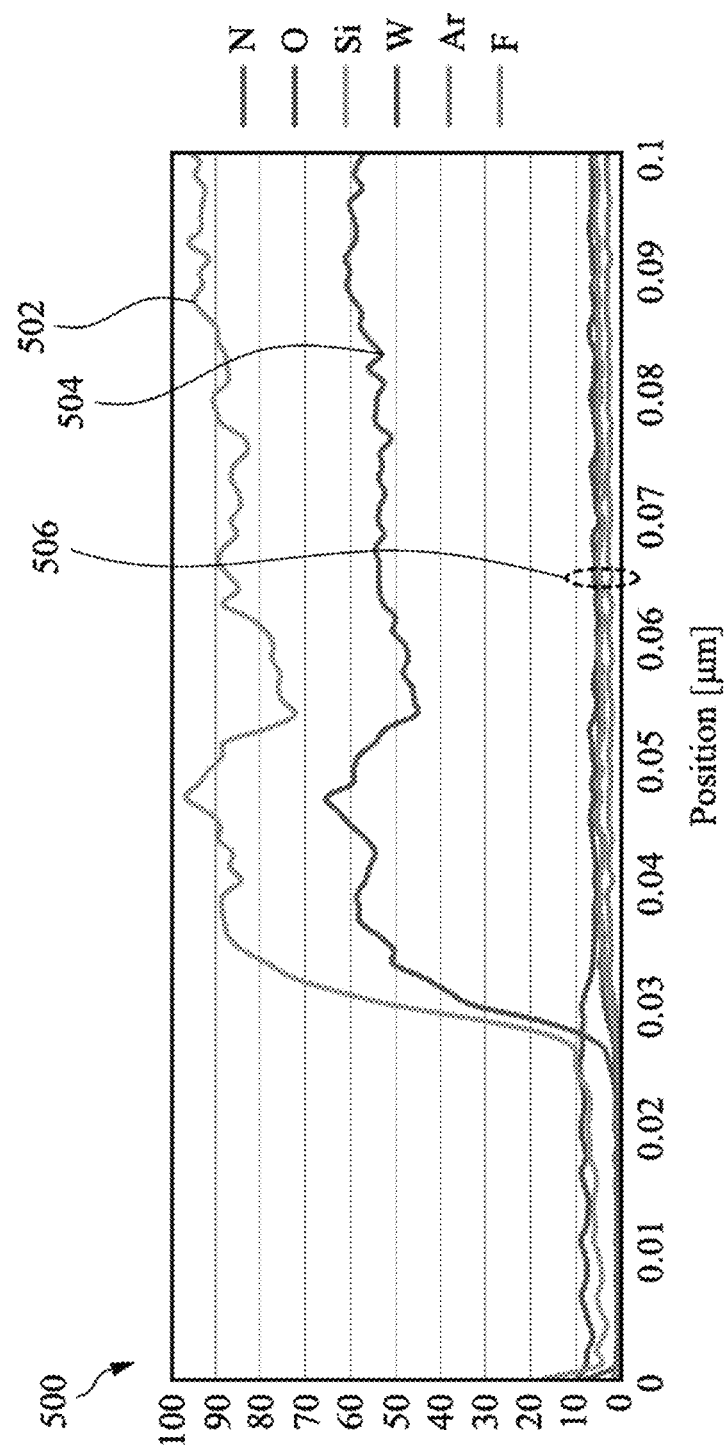
FIG. 5 shows a concentration profile of the conductive structure formed according to the process steps shown in FIG. 4A to FIG. 4H.

FIG. 5 shows a concentration profile 500 taken along the line A-A' shown in FIG. 4H. The concentration profile shows the variation in concentration of various materials as a function of position, with the position 0 micrometers shown in FIG. 5 being at point A and the position 0.1 micrometers shown in FIG. 5 being at point A'.

It may be observed that even with the application of the etch process 320 to remove the treated portions of the first seed layer 312*t*, there are no excessive amounts of undesirable materials introduced into the conductive structure formed within the third recess 400 that may adversely affect conductivity and/or resistivity of the conductive structures. For example, as shown in FIG. 5, oxygen, argon and fluorine (shown in FIG. 5 as the group of curves 506) are present in the conductive structure formed in the third recess 400 in low concentrations (e.g. less than about 10 units). On the other hand, silicon (shown in FIG. 5 as the curve 502) and tungsten (shown in FIG. 5 as the curve 504) have relatively high concentrations in the third recess 400, as expected.

Figure 6:
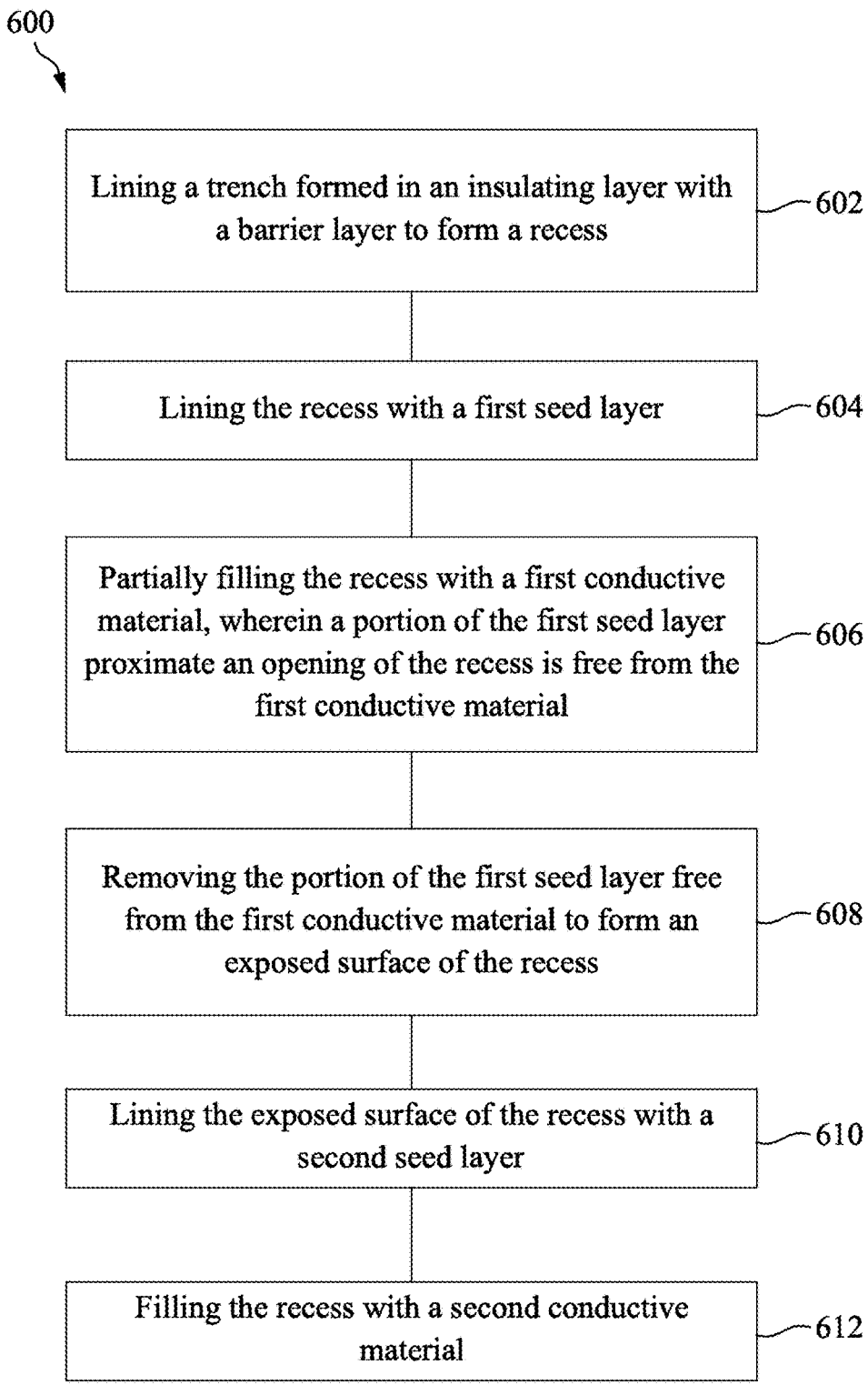
FIG. 6 shows a method of forming a conductive structure, in accordance with some embodiments.

Based on the process flows shown in FIG. 3A to FIG. 3H and FIG. 4A to FIG. 4H, a method 600 of forming a conductive structure may be provided (shown in FIG. 6). As shown in FIG. 6, the method 600 may include: lining a trench formed in an insulating layer with a barrier layer to form a recess (in 602); lining the recess with a first seed layer (in 604); partially filling the recess with a first conductive material, wherein a portion of the first seed layer proximate an opening of the recess is free from the first conductive material (in 606); removing the portion of the first seed layer free from the first conductive material to form an exposed surface of the recess (in 608); lining the exposed surface of the recess with a second seed layer (in 610); and filling the recess with a second conductive material (in 612).

One embodiment is a structure including a substrate with a first recess formed therein. A barrier layer lines the first recess of the substrate. A first seed layer can be on the barrier layer and line a bottom of the first recess and partially line sidewalls of the recess. A first conductive material can partially fill the first recess to form a second recess. The top surface of the first conductive material can coincide with a vertical extent of the first seed layer. The top surface can have a depression formed therein. A second seed layer can be on the barrier layer and line the second recess. A second conductive material can fill the second recess.

One embodiment is a device including an insulating layer having a first recess and a second recess formed therein. The first recess can extend through the insulating layer to a substrate and the second recess can extend partially through the insulating layer. A barrier layer can line the first recess and the second recess. A first seed layer can be on the barrier layer and line a bottom of the first recess and partially line sidewalls of the first recess. The first seed layer does not line the second recess. A first conductive material can be made to partially fill the first recess to form a third recess. The first conductive material can cover the first seed layer. A second seed layer can be on the barrier layer and line the second recess and the third recess. A second conductive material can fill the second recess and the third recess.

One embodiment is a method which includes providing a substrate having a trench formed therein. A barrier layer can be formed in the trench. The barrier layer can be thicker at a top of the trench to form an overhang comprising barrier layer material. The trench can be lined with a first seed layer. The trench can be partially filled with a first conductive material. A portion of the first seed layer free from the first conductive material can be removed, leaving the barrier layer substantially intact to expose a surface of the barrier layer including the overhang.

According to various embodiments presented herein, a method of forming a conductive structure may be provided. The method may include: providing a substrate having a recess formed therein, the recess lined with a first seed layer and partially filled with a first conductive material; removing a portion of the first seed layer free from the first conductive material to form an exposed surface of the recess; lining the exposed surface of the recess with a second seed layer; and filling the recess with a second conductive material, the second conductive material covering the first conductive material and the second seed layer.

According to various embodiments presented herein, a method of forming a conductive structure may be provided. The method may include: providing a substrate having a first recess and a second recess formed therein, wherein the first recess extends into the substrate by a first distance and the second recess extends into the substrate by a second distance smaller than the first distance; lining the first recess and the second recess with a first seed layer; exposing the first seed layer in the second recess and a portion of the first seed layer in the first recess proximate an opening of the first recess to a treatment plasma to form treated portions of the first seed layer; partially filling the first recess with a first conductive material, wherein the treated portions of the first seed layer are free from the first conductive material; removing the treated portions of the first seed layer to form exposed surfaces of the first recess and the second recess; lining the exposed surfaces of the first recess and the second recess with a second seed layer; and covering the second seed layer with a second conductive material, the second conductive material filling the first recess and the second recess.

According to various embodiments presented herein, a method of forming a conductive structure may be provided. The method may include: lining a trench formed in an insulating layer with a barrier layer to form a recess; lining the recess with a first seed layer; partially filling the recess with a first conductive material, wherein a portion of the first seed layer proximate an opening of the recess is free from the first conductive material; removing the portion of the first seed layer free from the first conductive material to form an exposed surface of the recess; lining the exposed surface of the recess with a second seed layer; and filling the recess with a second conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a substrate;
   a barrier layer disposed in the substrate, the barrier layer having a bottom portion and side portions, the side portions extending continuously from a top surface of the substrate to the bottom portion of the barrier layer;
   a first seed layer disposed on the barrier layer, the first seed layer having an uppermost extent disposed between the top surface of the substrate and the bottom portion of the barrier layer;
   a first conductive material surrounded by the first seed layer, a top surface of the first conductive material coinciding with the uppermost extent of the first seed layer, the top surface of the first conductive material having a depression formed therein;
   a second seed layer, the second seed layer having a bottom portion on the first conductive material and side portions extending from the uppermost extent of the first seed layer to the top surface of the substrate; and
   a second conductive material surrounded by the second seed layer.

2. The structure of claim 1, further comprising:
   a third seed layer disposed in the substrate, the third seed layer laterally separated from the first seed layer, the third seed layer extending from the top surface of the substrate shallower than the first seed layer, wherein the third seed layer is a same material as the second seed layer.

3. The structure of claim 2, further comprising:
   a third conductive material surrounded by the third seed layer, wherein a top surface of the second conductive material and a top surface of the third conductive material are level.

4. The structure of claim 1, wherein the barrier layer forms an overhang such that the barrier layer is thicker at a top surface of the second conductive material than at sidewalls of the first conductive material.

5. The structure of claim 4, wherein the overhang corresponds to a narrow portion of the second conductive material, wherein the narrow portion of the second conductive material is narrower than a portion of the second conductive material below the overhang.

6. The structure of claim 4, wherein the top surface of the first conductive material is proximate a bottom of the overhang.

7. A device, comprising:
   an insulating layer having a first recess and a second recess formed therein, the first recess extending through the insulating layer and exposing a substrate, the second recess extending partially through the insulating layer;
   a barrier layer lining the first recess and the second recess, the barrier layer continuously extending from a top surface of the insulating layer to respective bottoms of the first recess and the second recess;
   a first seed layer on the barrier layer lining a bottom of the first recess and partially lining sidewalls of the first recess, the first seed layer not lining the second recess;
   a first conductive material partially filling the first recess to form a third recess, the first conductive material covering the first seed layer;
   a second seed layer on the barrier layer lining the second recess and the third recess; and
   a second conductive material filling the second recess and the third recess.

8. The device of claim 7, wherein a top surface of the first conductive material has a depression formed therein.

9. The device of claim 7, wherein a top surface of the second conductive material of the second recess and a top surface of the second conductive material of the third recess are coplanar.

10. The device of claim 7, wherein the barrier layer forms an overhang such that the barrier layer is thicker near an opening of the first recess than inside the first recess.

11. The device of claim 10, wherein the overhang forms an opening to the first recess narrower than a portion of the first recess below the overhang.

12. The device of claim 10, wherein a top surface of the first conductive material is proximate a bottom of the overhang.

13. The device of claim 7, wherein the first seed layer has a thickness between about 1 nm and about 5 nm.

14. The device of claim 7, wherein the first conductive material is electrically coupled to an electronic component formed in the substrate.

15. A device, comprising:
    a substrate having a first trench formed therein;
    a barrier layer lining the first trench of the substrate, the barrier layer being thicker at a top of the first trench to form an overhang comprising barrier layer material, wherein the overhang forms an opening to the first trench, wherein the opening is narrower than a portion of the first trench below the overhang;
    a first seed layer on the barrier layer lining a bottom of the first trench and partially lining sidewalls of the first trench;
    a first conductive material partially filling the first trench to form a second trench, a top surface of the first conductive material coinciding with a vertical extent of the first seed layer;
    a second seed layer on the barrier layer lining the second trench; and
    a second conductive material filling the second trench.

16. The device of claim 15, wherein a top surface of the second conductive material is planarized to be coplanar with a top surface of the barrier layer.

17. The device of claim 15, wherein the second seed layer is formed on the overhang of barrier layer material, the second seed layer having a portion which is directly over the second conductive material.

18. The device of claim 15, wherein the first seed layer has a thickness between about 1 nm and about 5 nm.

19. The device of claim 15, wherein the first conductive material is electrically coupled to an electronic component formed in the substrate.

20. The device of claim 15, wherein a top surface of the first conductive material has a depression formed therein.

* * * * *